(12) United States Patent
Fukami

(10) Patent No.: US 7,659,727 B2
(45) Date of Patent: Feb. 9, 2010

(54) MULTILAYER WIRING BOARD AND METHOD FOR TESTING THE SAME

(75) Inventor: Yoshiyuki Fukami, Chikusei (JP)

(73) Assignee: Micronics Japan Co., Ltd., Musashino-Shi (JP)

( * ) Notice: Subject to any disclaimer, the term of this patent is extended or adjusted under 35 U.S.C. 154(b) by 151 days.

(21) Appl. No.: 12/072,704

(22) Filed: Feb. 27, 2008

(65) Prior Publication Data

US 2008/0204038 A1    Aug. 28, 2008

(30) Foreign Application Priority Data

Feb. 28, 2007   (JP) ............................... 2007-049225

(51) Int. Cl.
*G01R 31/02*   (2006.01)
*G01R 27/26*   (2006.01)
(52) U.S. Cl. ....................................... 324/537; 324/658
(58) Field of Classification Search ................. 324/537, 324/658
See application file for complete search history.

(56) References Cited

U.S. PATENT DOCUMENTS 7,091,716 B2 * 8/2006 Nakamura ............... 324/158.1
7,138,805 B2 * 11/2006 Ishioka et al. ................ 324/658
7,284,311 B2 * 10/2007 Nakamura ..................... 29/593

FOREIGN PATENT DOCUMENTS

JP        53-10863        1/1978

OTHER PUBLICATIONS

Related U.S. Appl. No. 12/072,703, filed Feb. 27, 2008; Inventor: Yoshiyuki Fukami, Title: Multilayer Wiring Board and Method for Testing the Same.

* cited by examiner

*Primary Examiner*—Timothy J Dole
(74) *Attorney, Agent, or Firm*—Frishauf, Holtz, Goodman & Chick, P.C.

(57) ABSTRACT

A multilayer wiring board has a ceramic substrate, on which a multilayer wiring section is formed. One of the conductor layers has a grounded pattern. Each of the conductor layers has a reference pattern, which is usable as a standard in calculation of an electric capacitance. An electric capacitance is measured between the grounded pattern and the three-dimensional wiring path. On the other hand, a theoretical electrical capacitance is calculated on the basis of a reference value of electric capacitance which has been measured between the reference pattern and the grounded pattern. The measured value for the wiring path is compared to the calculated value to determine whether the three-dimensional wiring path is good or bad. As the multilayer wiring section has the reference patterns, the electric capacitance for the normal wiring path can be obtained by calculation without preparing the normal acceptable product.

5 Claims, 14 Drawing Sheets

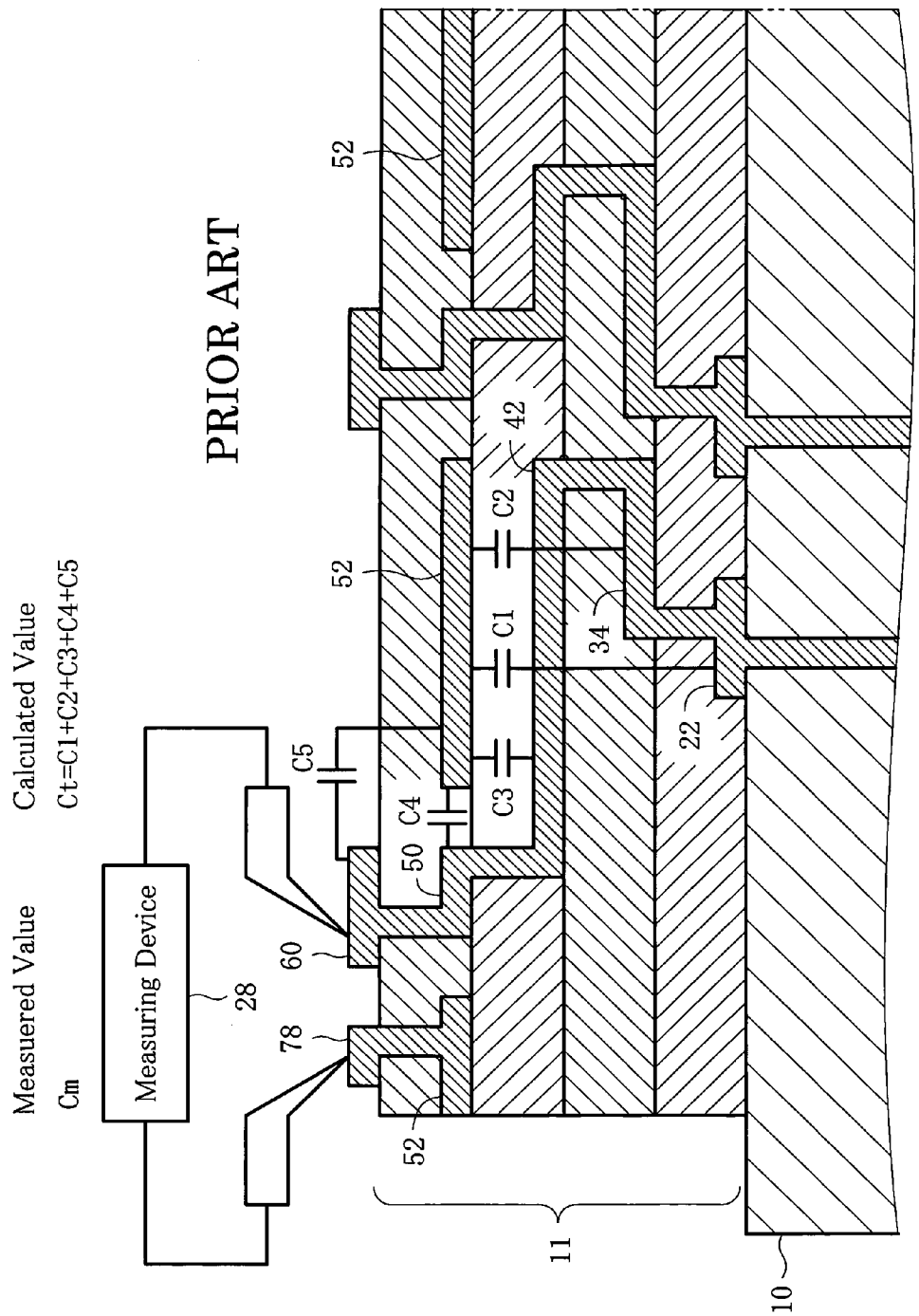

MULTILAYER WIRING BOARD AND METHOD FOR TESTING THE SAME

BACKGROUND OF THE INVENTION

The present invention relates to a multilayer wiring board, which is usable in a probe card and the like, and a method for testing such a multilayer wiring board, and especially to a multilayer wiring board including a wiring path whose electric capacitance is measured to inspect whether the wiring path is good or bad, and a method for testing such a multilayer wiring board.

A technique for measuring the electric capacitance between a signal line and the grounded layer in a multilayer wiring board to detect a break and a short circuit of the signal line is known and disclosed in Japanese Patent Publication No. 53-10863 A (1978), which will be referred to as the first publication.

The first publication discloses a multilayer wiring board, which includes therein a grounded layer consisting of an overall conductor film. The electric capacitance between the grounded layer and a signal line is measured, and then the measured value is compared to a calculated value of the electric capacitance to detect a break and a short circuit of the signal line.

Referring to FIG. 14, there is shown a sectional view showing the conventional method for testing a multilayer wiring board with the use of the technique described above. A multilayer wiring section 11 is formed on a ceramic substrate 10. The multilayer wiring section 11 has five conductor layers, which include wiring patterns 22, 34, 42, 50 and 60 respectively. These wiring patterns are connected to each other via connecting conductors to make up a three-dimensional wiring path. The fourth conductor layer further includes a grounded pattern 52, which is connected to a test pad 78 located on a surface of the multilayer wiring section 11. Since the three-dimensional wiring path extends to the uppermost wiring pattern 60, it is possible to determine whether the wiring path is good or bad by measuring, with a measuring device 28, an electric capacitance between the test pad 78 and the uppermost wiring pattern 60. When the measured value Cm of electric capacitance differs widely from the calculated value, it can be determined that the wiring path may suffer a break or a short circuit. The calculated value Ct of electric capacitance is a total of a calculated value C1 of electric capacitance between the grounded pattern 52 and the wiring pattern 22 of the first conductor layer, a calculated value C2 of electric capacitance between the grounded pattern 52 and the wiring pattern 34 of the second conductor layer, a calculated value C3 of electric capacitance between the grounded pattern 52 and the wiring pattern 42 of the third conductor layer, a calculated value C4 of electric capacitance between the grounded pattern 52 and the wiring pattern 50 of the fourth conductor layer, and a calculated value C5 of electric capacitance between the grounded pattern 52 and the wiring pattern 60 of the fifth conductor layer.

The conventional testing method described above requires that the normal electric capacitance between the signal line and the grounded layer is known. One solution for finding the known normal capacitance is to prepare the acceptable products having normal electric capacitances (i.e., the products that are ascertained to have no break nor short circuit) for a variety of the multilayer wiring boards, but this solution is troublesome and expensive. Alternatively, the normal electric capacitance may be obtained by calculation as mentioned above, but this solution is unsure about the calculation reliability under the influence of the fluctuations in production quality of the multilayer wiring section.

SUMMARY OF THE INVENTION

It is an object of the present invention to provide a multilayer wiring board and a method for testing it, the multilayer wiring board enabling an operator to accurately calculate a normal electric capacitance between a signal line and a certain conductor layer without preparing the normal acceptable product.

A multilayer wiring board according the present invention has a multilayer wiring section including plural conductor layers, each of which has a reference pattern having a predetermined length, the reference pattern being usable as a standard for the electric capacitance. The multilayer wiring board comprises: (a) an electrical insulating base substrate, which is a common part among a variety of the multilayer wiring boards; and (b) a multilayer wiring section formed on the base substrate, the multilayer wiring section being a characteristic part different from others among a variety of the multilayer wiring boards and having a laminated structure consisting of alternating layers of plural conductor layers and plural insulating layers, and the multilayer wiring section further having at least one three-dimensional wiring path, which consists of an interconnection of wiring patterns belonging to the respective conductor layers via connecting conductors passing through the respective insulating layers. At least one of the conductor layers includes a grounded pattern. The multilayer wiring section has a test pad, which appears on a surface of the multilayer wiring section and is connected to the grounded pattern. Each of the conductor layers in the multilayer wiring section includes a reference pattern having a predetermined length, the reference pattern being usable as a standard for an electric capacitance.

The testing method according to the present invention is a method for testing the multilayer wiring board mentioned above. The method comprises the step of providing the multilayer wiring board mentioned above, in which the reference pattern is connected to a reference pad appearing on a surface of the multilayer wiring section via a connecting conductor passing through at least one of the insulating layers. The method further comprises the steps of: obtaining a reference value of electric capacitance by measuring an electric capacitance between the reference pad and the test pad for each of the conductor layers; obtaining a calculated value of electric capacitance by calculating an electric capacitance between the wiring path and the grounded pattern with the use of an area ratio of the wiring pattern included in each of the conductor layers to each of the reference patterns and the reference value of electric capacitance for each of the conductor layers; obtaining a measured value of electric capacitance by measuring an electric capacitance between the test pad and an exposed end of the wiring path, the exposed end appearing on the surface of the multilayer wiring section; and determining whether the wiring path is good or bad by comparing the calculated value with the measured value.

The present invention has the advantage described below. Since each of the conductor layers in the multilayer wiring section has the reference pattern that is usable as a standard for the electric capacitance, a normal electric capacitance between a signal line and a certain conductor layer can be accurately calculated under no influence of the fluctuations in production quality of the multilayer wiring board without preparing the normal acceptable products for a variety of the multilayer wiring boards. Therefore, the present invention is useful especially for the limited production of a wide variety multilayer wiring boards.

BRIEF DESCRIPTION OF THE DRAWINGS

FIG. 14 is a sectional view showing the conventional method for testing a multilayer wiring board.

DETAILED DESCRIPTION OF THE PREFERRED EMBODIMENTS

Figure 1:
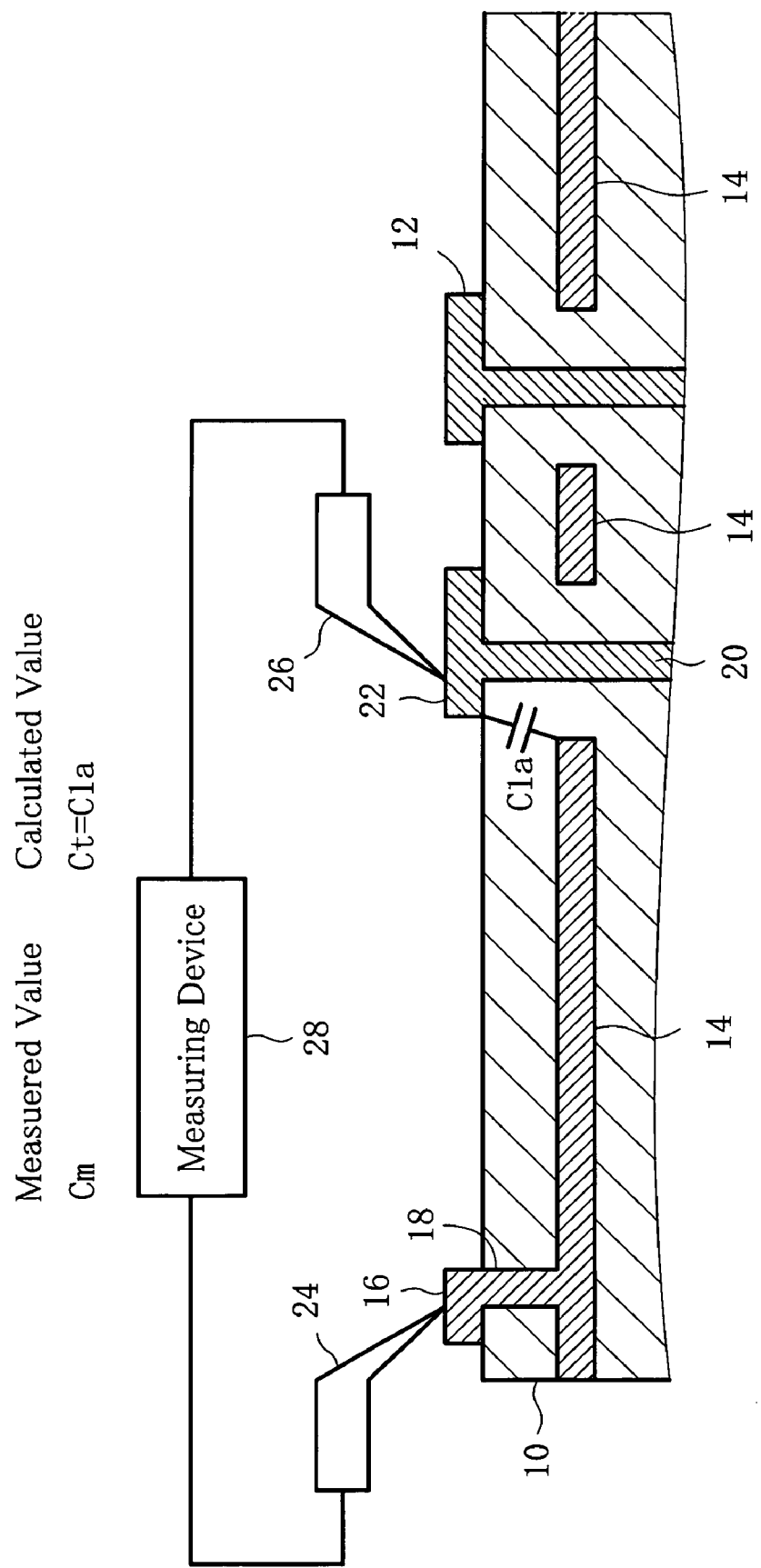
FIG. 1 is a sectional view showing the first embodiment of the multilayer wiring board according to the present invention under the condition just after formation of the first conductor layer of a multilayer wiring section, i.e., halfway through a production process.

Embodiments of the present invention will now be described in detail below with reference to the drawings. Referring to FIG. 1, there is shown a sectional view showing the first embodiment of the multilayer wiring board according to the present invention under the condition just after formation of the first conductor layer of a multilayer wiring section, i.e., halfway through a production process. It is noted, however, that a region including reference patterns will be explained later with reference to FIGS. 6 to 10. The multilayer wiring board has an electrical insulating ceramic substrate 10, which is the common part among a variety of the multilayer wiring boards, noting that the ceramic substrate 10 corresponds to the base substrate in the present invention. On the ceramic substrate 10 is formed a multilayer wiring section, which is the characteristic part different from others among a variety of the multilayer wiring boards. FIG. 1 shows the state just after formation of the first conductor layer 12 of the multilayer wiring section on the ceramic substrate 10.

Figure 11:
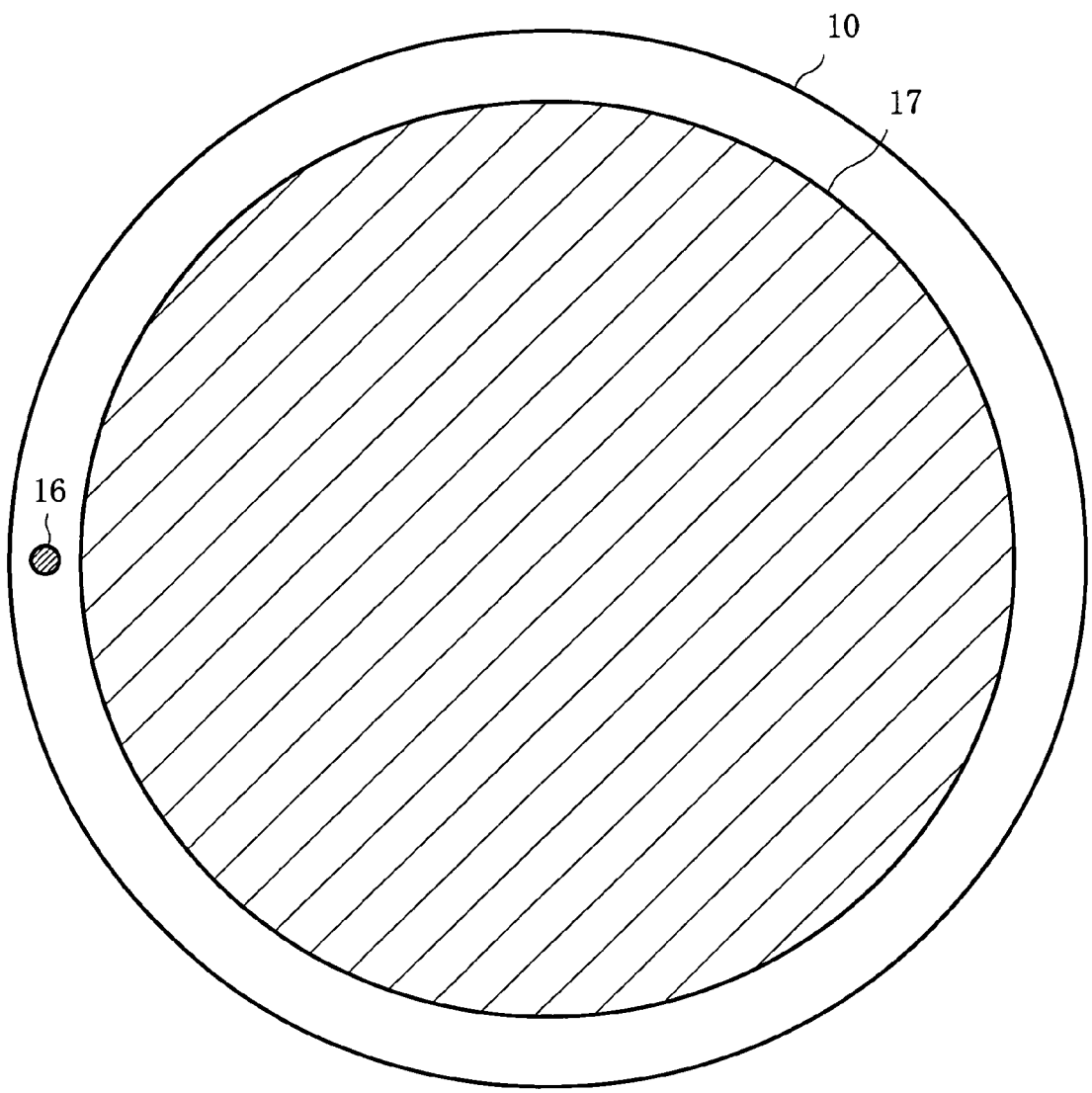
FIG. 11 is a plan view indicating, in the first embodiment, a plane location of a test pad on a ceramic substrate and a plane region occupied by the multilayer wiring section.

An internal conductor layer 14 is formed inside the ceramic substrate 10 over the almost all area except for locations of through-holes. A test pad 16 that is made of conductor is formed on the surface of the ceramic substrate 10 at the peripheral region, on which the multilayer wiring section does not exist. Referring now to FIG. 11, there is shown a plan view indicating a plane location of the test pad 16 on the ceramic substrate 10 and a plane region 17 occupied by the multilayer wiring section. The multilayer wiring board of this embodiment has been developed for a probe card that is usable for testing a semiconductor wafer having 300 mm in diameter. Referring again to FIG. 1, the test pad 16 is patterned in parallel with the first conductor layer 12. The test pad 16 is connected to the internal conductor layer 14 via a connecting conductor 18. The ceramic substrate 10 is formed with a predetermined number of through-holes, which are filled with through-hole conductors 20. The first conductor layer 12 is formed to have a predetermined wiring pattern 22, which is connected to the through-hole conductors 20. The through-hole conductor 20 has the lower end (not shown), which is connected to a pad located on the opposite surface of the ceramic substrate 10.

Just after formation of the first conductor layer 12 (i.e., halfway through a production process of the multilayer wiring board), an electric capacitance is measured between the wiring pattern 22 of the first conductor layer 12 and the internal conductor layer 14 inside the ceramic substrate 10. In making such a measurement, the first probe 24 is brought into contact with the test pad 16, and the second probe 26 is brought into contact with the wiring pattern 22. A measuring device 28 is connected between the first probe 24 and the second probe 26, and it can measure the electric capacitance between the wiring pattern 22 and the internal conductor layer 14. The measured value of electric capacitance is denoted by Cm. On the other hand, a calculated value of electric capacitance, which is denoted by Ct, is equal to a calculated value C1$a$ between the wiring pattern 22 and the internal conductor layer 14. If the difference between the measured value Cm and the calculated value Ct falls within the predetermined range, it can be decided that the wiring pattern 22 has no break nor short circuit, i.e., it is normal. In contrast, if the measured value is substantially smaller than the calculated value the wiring pattern is suspected of a break, whereas if the measured value is substantially greater than the calculated value the wiring pattern is suspected of a short circuit. When the wiring pattern is suspected of any defect, the defect may be repaired if possible, or contrary the production process may be cancelled at this time if repair is impossible. In the case of cancellation of the production, the multilayer wiring section (which includes only the first conductor layer 12 at this stage) may be removed as a bad section, and then the expensive ceramic substrate is reusable. The calculated value C1$a$ mentioned above can be calculated based on the electric capacitance of the after-mentioned reference pattern, the details of which will be described later.

Figure 2:
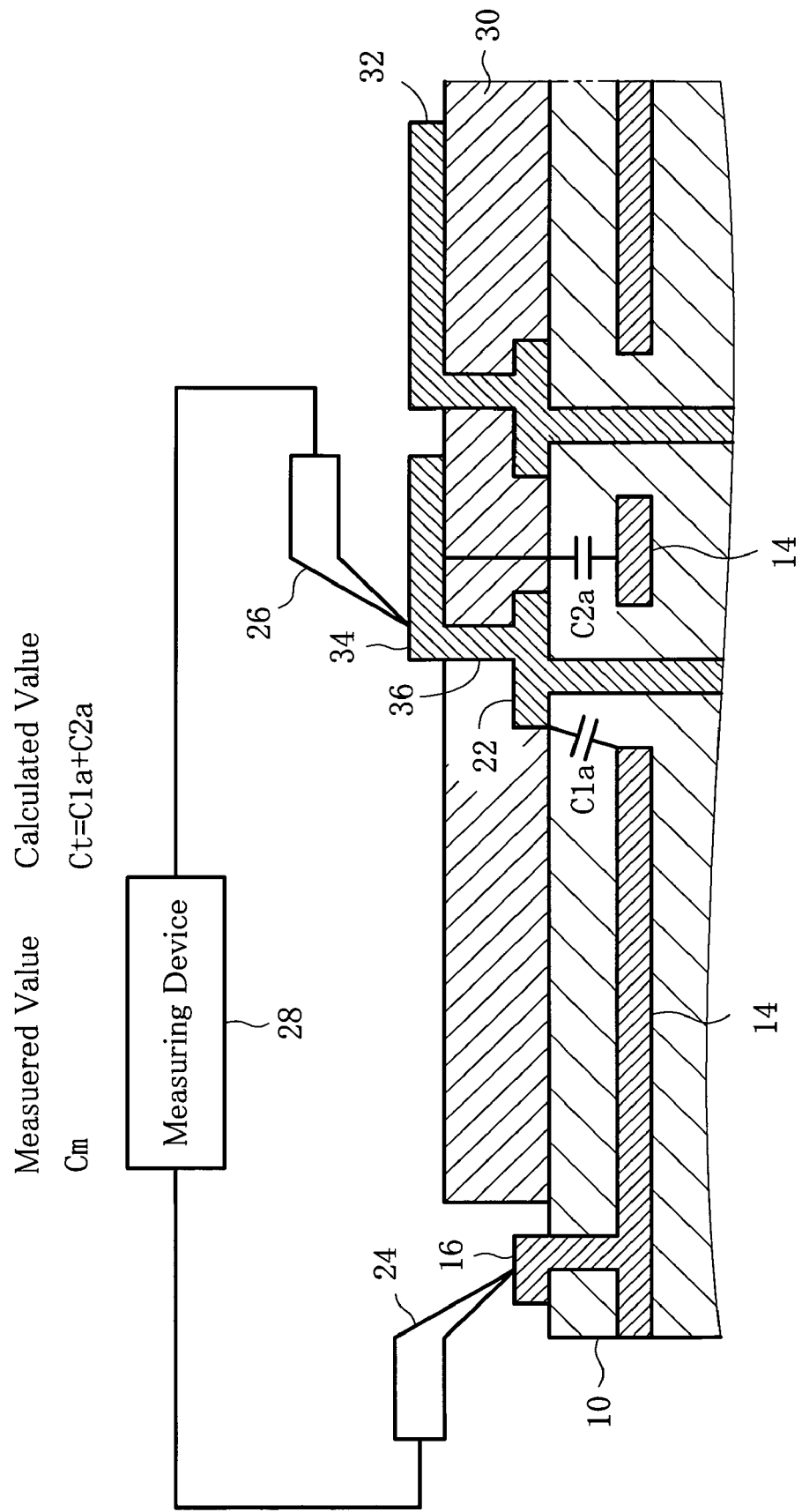
FIG. 2 is a sectional view showing the first embodiment after further formation of the first insulating layer and the second conductor layer on the state shown in FIG. 1.

Referring now to FIG. 2, there is shown a sectional view showing the first embodiment after further formation of the first insulating layer 30 (which is made of polyimide for example) and the second conductor layer 32 on the state shown in FIG. 1. The second conductor layer 32 is formed to have a predetermined wiring pattern 34, which is connected to the wiring pattern 22 of the first conductor layer via a connecting conductor 36 passing through the first insulating layer 30. After formation of the second conductor layer 32, an electric capacitance is measured between a three-dimensional wiring path that extends to the wiring pattern 34 of the second conductor layer 32 and the internal conductor layer 14 of the ceramic substrate 10. In making such a measurement, the first probe 24 is brought into contact with the test pad 16, and the second probe 26 is brought into contact with the wiring pattern 34. The measuring device 28, which is connected between the first probe 24 and the second probe 26, can measure the electric capacitance between the three-dimensional wiring path (which includes the wiring patterns 22 and 34) and the internal conductor layer 14. The measured value of electric capacitance is Cm. On the other hand, a calculated value Ct of electric capacitance is a total of a calculated value C1a between the wiring pattern 22 and the internal conductor layer 14 and a calculated value C2a between the wiring pattern 34 and the internal conductor layer 14. The existence of the connecting conductor 36 is negligible in calculation, because the connecting conductor 36 is smaller in size than the wiring patterns and further it is arranged almost perpendicular to the internal conductor layer 14. If the difference between the measured value Cm and the calculated value Ct falls within the predetermined range, it can be decided that the wiring path (which extends from the wiring pattern 22 to the wiring pattern 34) has no break nor short circuit, i.e., it is normal. If not, the wiring path is suspected of a break or a short circuit. Since the wiring pattern 22 of the first conductor layer has been assured normal in the state shown in FIG. 1, if any abnormality of electric capacitance is found in the state shown in FIG. 2, the abnormality would have been caused by the wiring pattern 34 of the second conductor layer 32 or the connecting conductor 36. The defect may be repaired if possible. If repair is impossible, all the multilayer wiring section that has been formed (i.e., from the first conductor layer to the second conductor layer) usually may be removed, and then the ceramic substrate is reusable. The calculated value C2a mentioned above will be described later.

Figure 3:
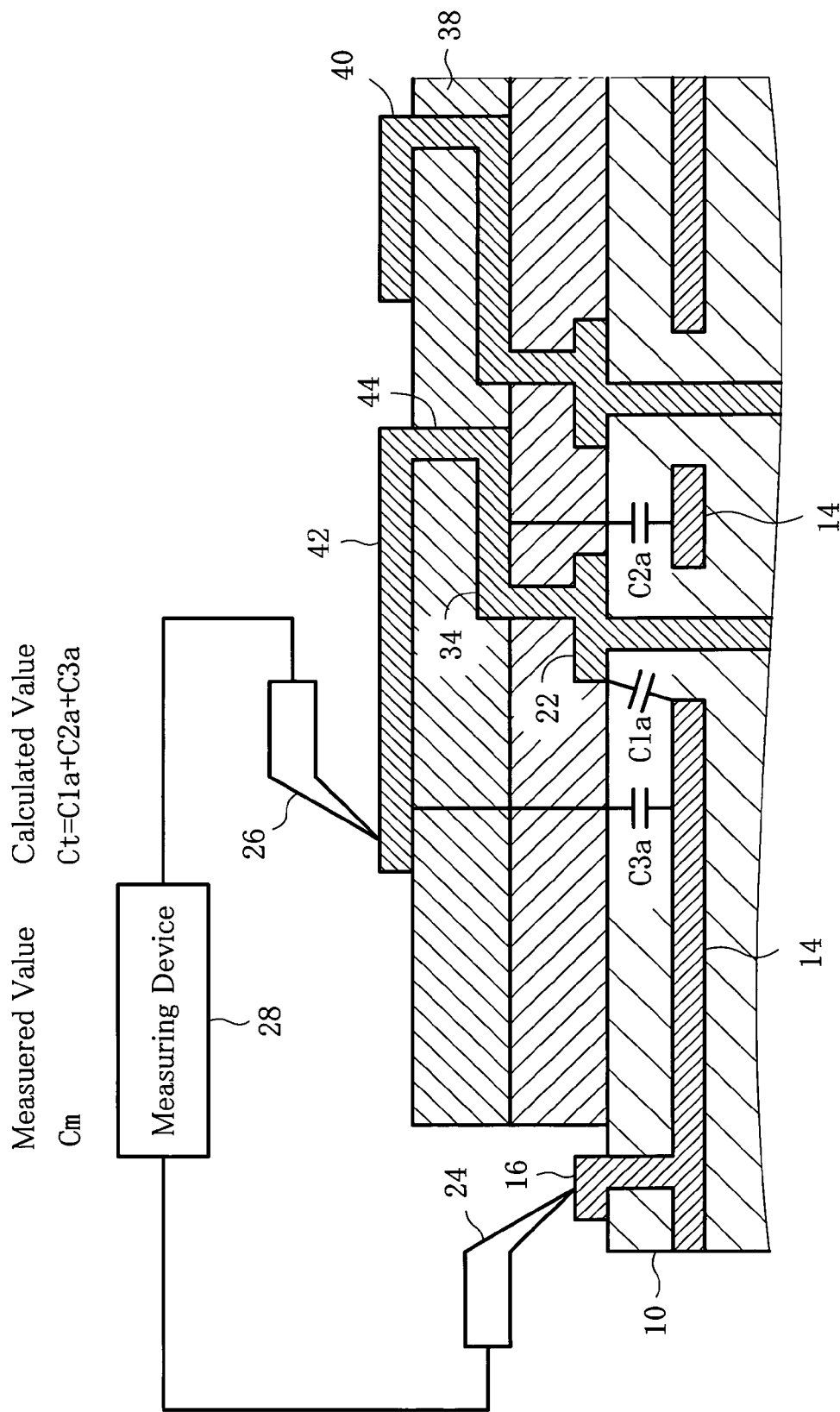
FIG. 3 is a sectional view showing the first embodiment after further formation of the second insulating layer and the third conductor layer on the state shown in FIG. 2.

Referring now to FIG. 3, there is shown a sectional view showing the first embodiment after further formation of the second insulating layer 38 and the third conductor layer 40 on the state shown in FIG. 2. The third conductor layer 40 is formed to have a predetermined wiring pattern 42, which is connected to the wiring pattern 34 of the second conductor layer via a connecting conductor 44 passing through the second insulating layer 38. After formation of the third conductor layer 40, an electric capacitance is measured between the three-dimensional wiring path that extends to the wiring pattern 42 of the third conductor layer 40 and the internal conductor layer 14 of the ceramic substrate 10. In making such a measurement, the first probe 24 is brought into contact with the test pad 16, and the second probe 26 is brought into contact with the wiring pattern 42. Then, the measuring device 28 measures the electric capacitance between the three-dimensional wiring path (which extends from the wiring pattern 22 of the first conductor layer to the wiring pattern 42 of the third conductor layer) and the internal conductor layer 14. The measured value of electric capacitance is Cm. On the other hand, a calculated value Ct of electric capacitance corresponding thereto is a total of a calculated value C1a between the wiring pattern 22 of the first conductor layer and the internal conductor layer 14, a calculated value C2a between the wiring pattern 34 of the second conductor layer and the internal conductor layer 14, and a calculated value C3a between the wiring pattern 42 of the third conductor layer and the internal conductor layer 14. If the difference between the measured value Cm and the calculated value Ct falls within the predetermined range, it can be decided that the wiring path (which extends from the wiring pattern 22 to the wiring pattern 42) has no break nor short circuit, i.e., it is normal. If not, the wiring pattern 42 of the third conductor layer or the connecting conductor 44 is suspected of any defect. The defect may be repaired if possible. If repair is impossible, all the multilayer wiring section that has been formed (i.e., from the first conductor layer to the third conductor layer) may be removed, and then the ceramic substrate is reusable.

Figure 4:
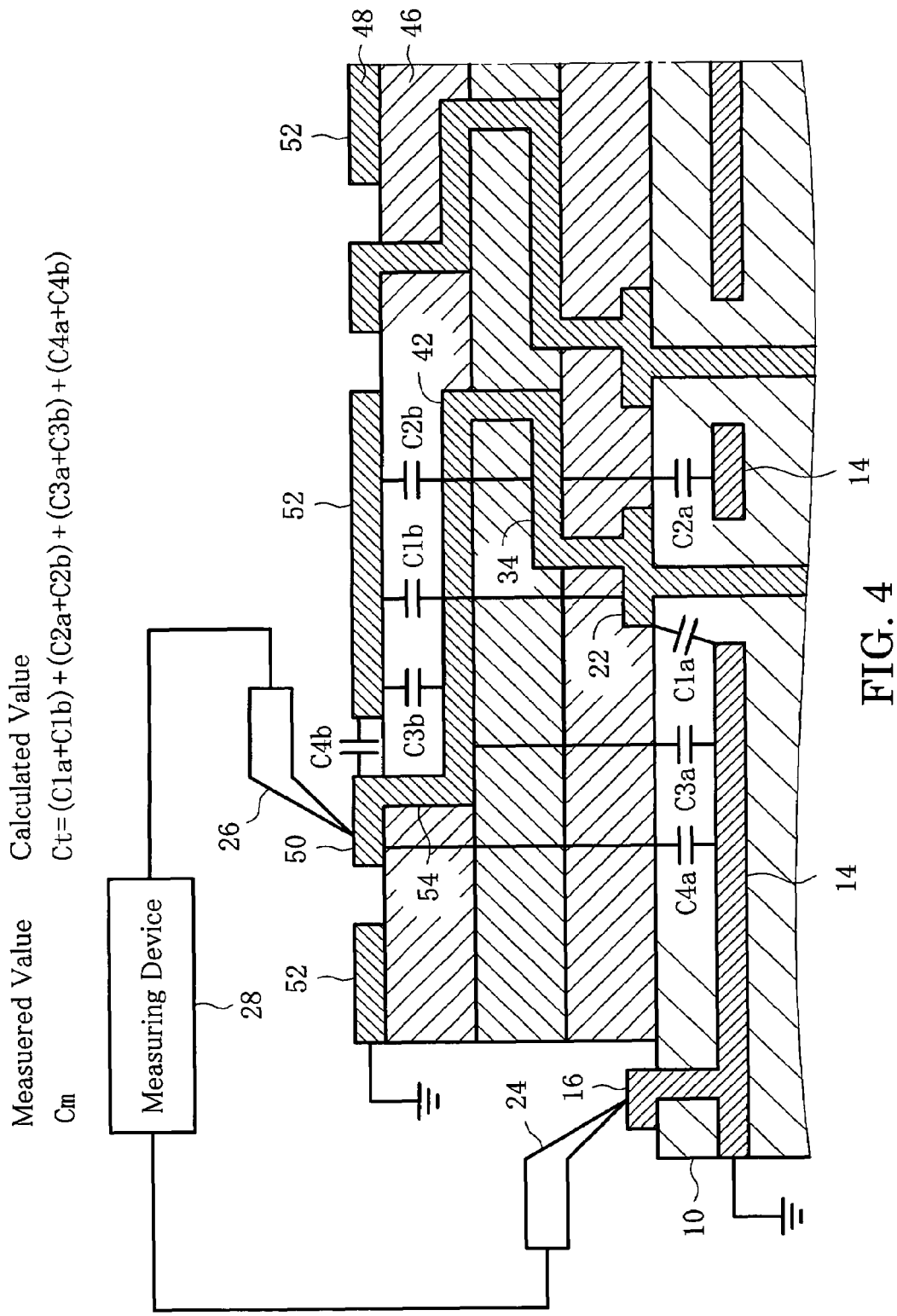
FIG. 4 is a sectional view showing the first embodiment after further formation of the third insulating layer and the fourth conductor layer on the state shown in FIG. 3.

Referring now to FIG. 4, there is shown a sectional view showing the first embodiment after further formation of the third insulating layer 46 and the fourth conductor layer 48 on the state shown in FIG. 3. The fourth conductor layer 48 is formed to have a predetermined wiring pattern 50 and a nearly overall grounded pattern 52 except for the wiring pattern 50. The wiring pattern 50 is connected to the wiring pattern 42 of the third conductor layer via a connecting conductor 54 passing through the third insulating layer 46. After formation of the fourth conductor layer 48, an electric capacitance is measured between the three-dimensional wiring path that extends to the wiring pattern 50 of the fourth conductor layer 48 and the ground potential. The ground potential exists on two sites: the internal conductor 14 of the ceramic substrate 10; and the grounded pattern 52 inside the multilayer wiring section. In making such a measurement, the first probe 24 is brought into contact with the test pad 16, and the second probe 26 is brought into contact with the wiring pattern 50. Then, the measuring device 28 measures the electric capacitance between the three-dimensional wiring path (which extends from the wiring pattern 22 of the first conductor layer to the wiring pattern 50 of the fourth conductor layer) and the ground potential. The measured value of electric capacitance is Cm. On the other hand, a calculated value Ct of electric capacitance corresponding thereto is a total of an electric capacitance between the wiring path and the internal conductor 14 of the ceramic substrate 10, and another electric capacitance between the wiring path and the grounded pattern 52 inside the multilayer wiring section. The electric capacitance coming from the wiring pattern 22 of the first conductor layer is a sum of a calculated value C1a of electric capacitance between it and the internal conductor 14 and a calculated value C1b of electric capacitance between it and the grounded pattern 52. The electric capacitance coming from the wiring pattern 34 of the second conductor layer is a sum of a calculated value C2a of electric capacitance between it and the internal conductor 14 and a calculated value C2b of electric capacitance between it and the grounded pattern 52. The electric capacitance coming from the wiring pattern 42 of the third conductor layer is a sum of a calculated value C3a of electric capacitance between it and the internal conductor 14 and a calculated value C3b of electric capacitance between it and the grounded pattern 52. The electric capacitance coming from the wiring pattern 50 of the fourth conductor layer is a sum of a calculated value C4a of electric capacitance between it and the internal conductor 14 and a calculated value C4b of electric capacitance between it and the grounded pattern 52. The calculated value Ct is a total of these sums. If the difference between the measured value Cm and the calculated value Ct falls within the predetermined range, it can be decided that the wiring path (which extends from the wiring pattern 22 to the wiring pattern 50) has no break nor short circuit, i.e., it is normal. If not, the wiring pattern 50 of the fourth conductor layer or the connecting conductor 54 is suspected of any defect. The defect may be repaired if possible. If repair is impossible, all the multilayer wiring section that has been formed (i.e., from the first conductor layer to the fourth conductor layer) may be removed, and then the ceramic substrate is reusable.

Figure 5:
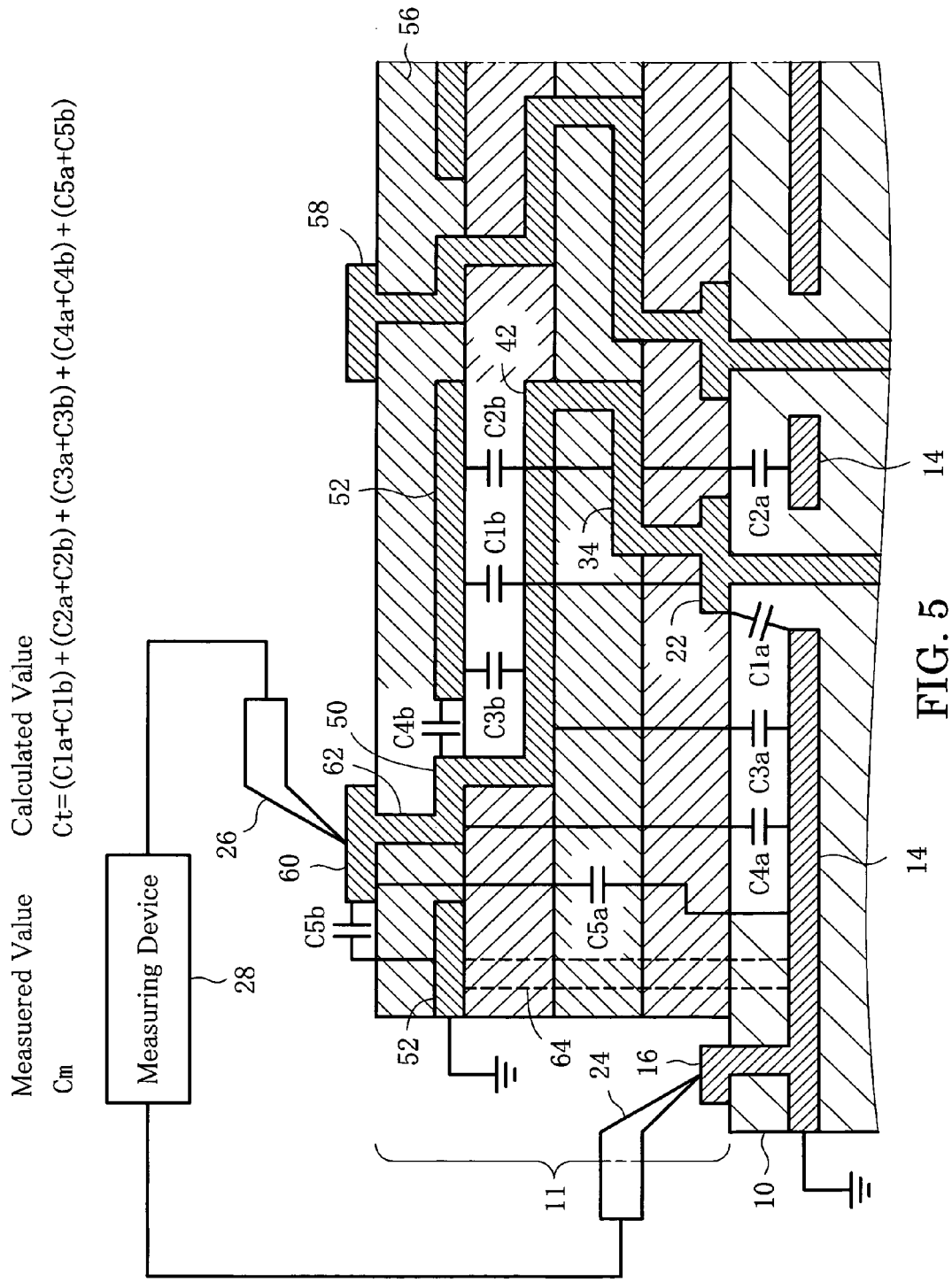
FIG. 5 is a sectional view showing the first embodiment after further formation of the fourth insulating layer and the fifth conductor layer on the state shown in FIG. 4.

Referring now to FIG. 5, there is shown a sectional view showing the first embodiment after further formation of the fourth insulating layer 56 and the fifth conductor layer 58 on the state shown in FIG. 4. The fifth conductor layer 58 appears on the surface of the multilayer wiring section 11, and it is formed to have a predetermined wiring pattern 60, which provides element mounting pads. The wiring pattern 60 is connected to the wiring pattern 50 of the fourth conductor layer via a connecting conductor 62 passing through the fourth insulating layer 56. Formation of the fifth conductor layer 58 completes the multilayer wiring section 11. After this final formation, an electric capacitance is measured between the three-dimensional wiring path that extends to the wiring pattern 60 of the fourth conductor layer 58 and the ground potential. In making such a measurement, the first probe 24 is brought into contact with the test pad 16, and the second probe 26 is brought into contact with the wiring pattern 60. Then, the measuring device 28 measures the electric capacitance between the three-dimensional wiring path (which extends from the wiring pattern 22 of the first conductor layer to the wiring pattern 60 of the fifth conductor layer) and the ground potential. The measured value of electric capacitance is Cm. On the other hand, a calculated value Ct of electric capacitance corresponding thereto is a total of an electric capacitance between the wiring path and the internal conductor 14 of the ceramic substrate 10, and another electric capacitance between the wiring path and the grounded pattern 52 inside the multilayer wiring section. The electric capacitance coming from the wiring pattern 22 of the first conductor layer is a sum of a calculated value C1a of electric capacitance between it and the internal conductor 14 and a calculated value C1b of electric capacitance between it and the grounded pattern 52. The electric capacitance coming from the wiring pattern 34 of the second conductor layer is a sum of a calculated value C2a of electric capacitance between it and the internal conductor 14 and a calculated value C2b of electric capacitance between it and the grounded pattern 52. The electric capacitance coming from the wiring pattern 42 of the third conductor layer is a sum of a calculated value C3a of electric capacitance between it and the internal conductor 14 and a calculated value C3b of electric capacitance between it and the grounded pattern 52. The electric capacitance coming from the wiring pattern 50 of the fourth conductor layer is a sum of a calculated value C4a of electric capacitance between it and the internal conductor 14 and a calculated value C4b of electric capacitance between it and the grounded pattern 52. The electric capacitance coming from the wiring pattern 60 of the fifth conductor layer is a sum of a calculated value C5a of electric capacitance between it and the internal conductor 14 and a calculated value C5b of electric capacitance between it and the grounded pattern 52. The calculated value Ct is a total of these sums. If the difference between the measured value Cm and the calculated value Ct falls within the predetermined range, it can be decided that the wiring path (which extends from the wiring pattern 22 to the wiring pattern 60) has no break nor short circuit, i.e., it is normal. If not, the wiring pattern 60 of the fifth conductor layer or the connecting conductor 62 is suspected of any defect. The defect may be repaired if possible. If repair is impossible, all the multilayer wiring section that has been formed (i.e., from the first conductor layer to the fifth conductor layer) may be removed, and then the ceramic substrate is reusable.

The internal conductor layer 14 may be connected to the grounded pattern 52 via a connecting conductor 64 for making an interconnection within the multilayer wiring section 11.

The measured and calculated values of electric capacitance in the present invention would depend on the widths and the lengths of the wiring patterns and the material of the insulating layers, these values being about several picofarads to a hundred picofarads.

Figure 12:
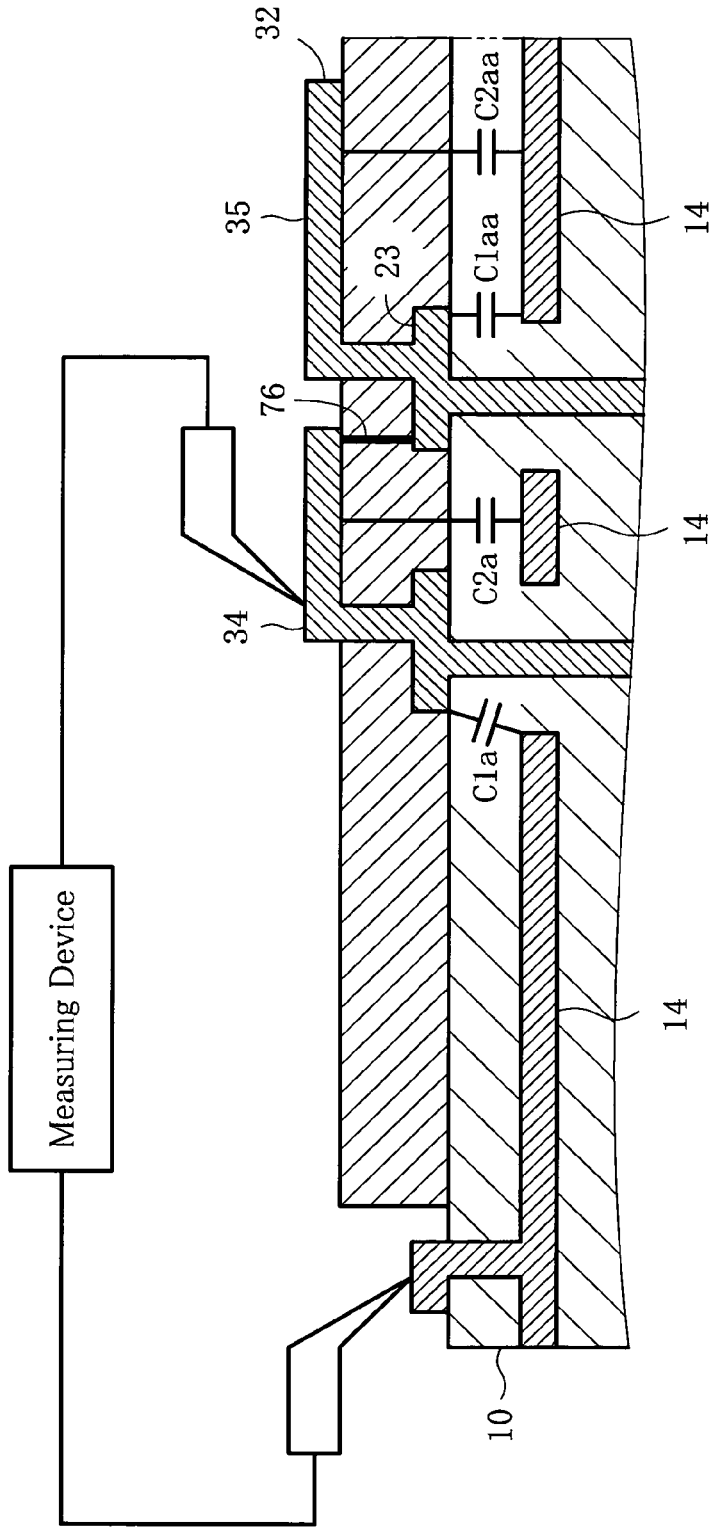
FIG. 12 is a sectional view of the first embodiment for explaining the case of short circuit occurrence in the wiring path.

Referring now to FIG. 12, there is shown a sectional view of the first embodiment for explaining the case of short circuit occurrence in the wiring path. FIG. 12 shows a state after formation of the second conductor layer 32, and this figure is similar to the sectional view shown in FIG. 2. The wiring pattern 34 of the second conductor layer 32 is short-circuited at a short circuit point 76 to a certain wiring pattern 23 of the first conductor layer. Now, the electric capacitance for the three-dimensional wiring path that extends to the wiring pattern 34 will be discussed below. A calculated value Ct under no short circuit condition is as follows:

$$Ct = C1a + C2a.$$

In contrast, an electric capacitance Ct2 under the short circuit condition is as follows:

$$Ct2 = (C1a + C1aa) + (C2a + C2aa).$$

The symbol C1aa denotes an electric capacitance between the wiring pattern 23, to which the wiring pattern 34 is short circuited, and the internal conductor 14. The symbol C2aa is an electric capacitance between a wiring pattern 35 of the second conductor layer, to which the thus connected wiring pattern 23 is further connected, and the internal conductor 14. As these electric capacitances are added, the electric capacitance Ct2 under the short circuit condition becomes greater than the electric capacitance Ct under no short circuit condition. The measured value Cm of electric capacitance under the short circuit condition would be close to the value Ct2 mentioned above. Therefore, comparing the measured value Cm with the calculated value Ct, it will be seen that the former is widely greater than the latter, representing the short circuit occurrence.

Figure 6:
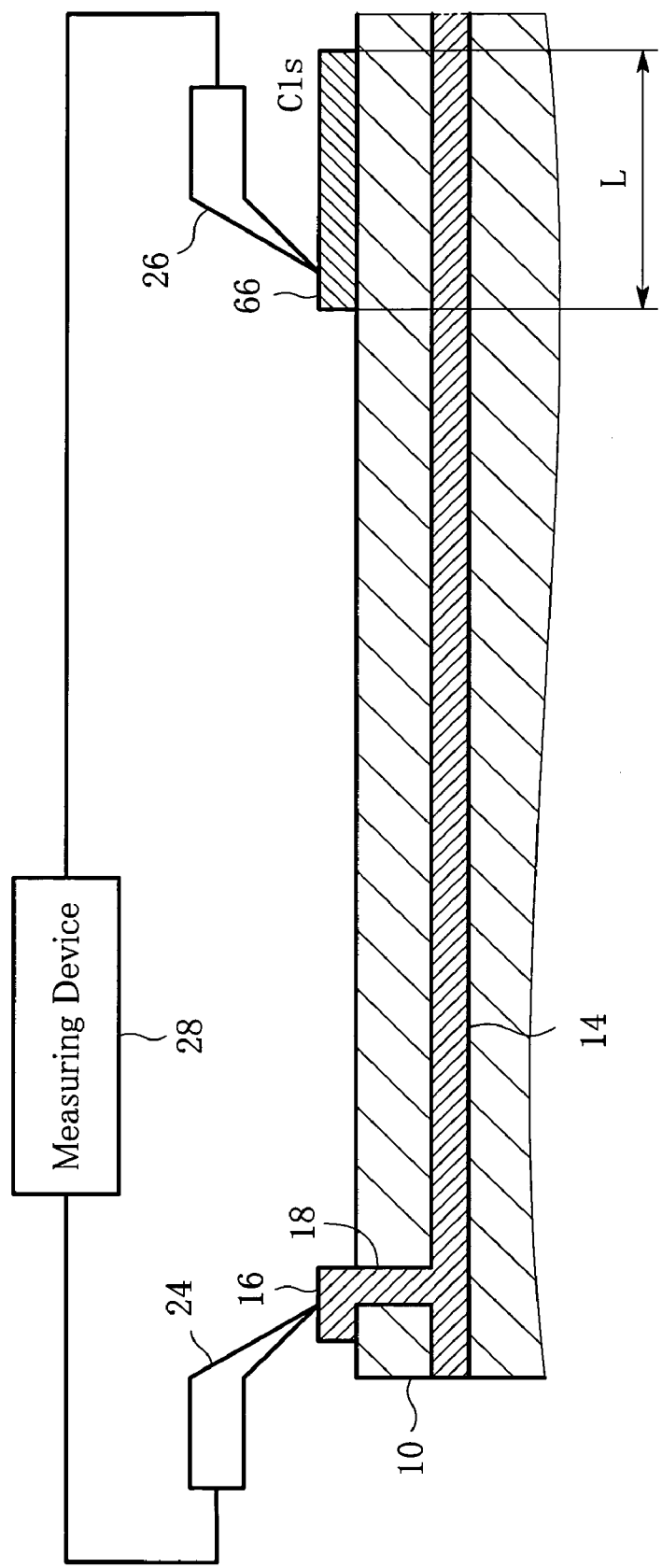
FIG. 6 is a sectional view showing a region including reference patterns in the first embodiment just after formation of the first conductor layer of a multilayer wiring section.

Next, the feature of the present invention, which is "a reference pattern usable as the standard for an electric capacitance", will now be described. FIGS. 6 to 10, which correspond to FIGS. 1 to 5, are sectional views indicating a region including the reference patterns in the first embodiment mentioned above. Referring now to FIG. 6, there is shown a sectional view showing only the region including the reference patterns in the first embodiment just after formation of the first conductor layer of a multilayer wiring section. It is noted that other wiring patterns (not shown) except for the reference patterns being the same as those shown in FIG. 1.

Continuing to refer to FIG. 6, the internal conductor layer 14 is formed inside the ceramic substrate 10 over the almost all area except for locations of the through-holes. The test pad 16 that is made of conductor is formed on the surface of the ceramic substrate 10 at the peripheral region, on which the multilayer wiring section does not exist. The test pad 16 is patterned in parallel with the first conductor layer. The test pad 16 is connected to the internal conductor layer 14 via the connecting conductor 18. These configurations have been described. On the ceramic substrate 11 is formed the first conductor layer, which includes the first reference pattern 66, which is usable as the standard in calculating an electric capacitance for the wiring pattern made of the first conductor layer. The first reference pattern 66 has the predetermined width W and the predetermined length L, which may be 10 mm for example. An electric capacitance is measured between the first reference pattern 66 and the internal conductor layer 14. Namely, after formation of the first conductor layer, the first probe 24 is brought into contact with the test pad 16, and the second probe 26 is brought into contact with the first reference pattern 66. Then, the measuring device 28, which is connected between the first probe 24 and the second probe 26, measures the electric capacitance between the first reference pattern 66 and the internal conductor layer 14. The measured value of electric capacitance is denoted by C1s, which is usable as the standard in calculating an electric capacitance for the wiring pattern made of the first conductor layer. That is to say, the electric capacitance C1s is multiplied by an area ratio k1 of the wiring pattern to the first reference pattern 66 to give an electric capacitance C1a (see FIG. 1) for the wiring pattern made of the first conductor layer. For example, if the area of the wiring pattern is twice the area of the first reference pattern 66, the calculated electric capacitance of the wiring pattern is double C1s.

Assuming that the conventional method disclosed in the first publication is used, an electric capacitance for the wiring pattern can be calculated with the use of the dielectric constant of the ceramic substrate (and also the dielectric constants of the first and subsequent insulating layers in calculation for the wiring patterns of the second and subsequent conductor layers) and the distance between the first conductor layer and the internal conductor layer of the ceramic substrate. In this case, the accuracy of the dielectric constant and the distance would affect the calculated value of electric capacitance, noting that the accuracy would depend on a degree of fluctuations in production quality. In contrast, the present invention can find the calculated value of electric capacitance for the wiring patterns of the respective conductor layers without the use of the dielectric constant and the distance but with the use of only the measured value of dielectric capacitance for the reference patterns of the respective conductor layers, provided that the areas of the respective wiring patterns should be determined.

Figure 7:
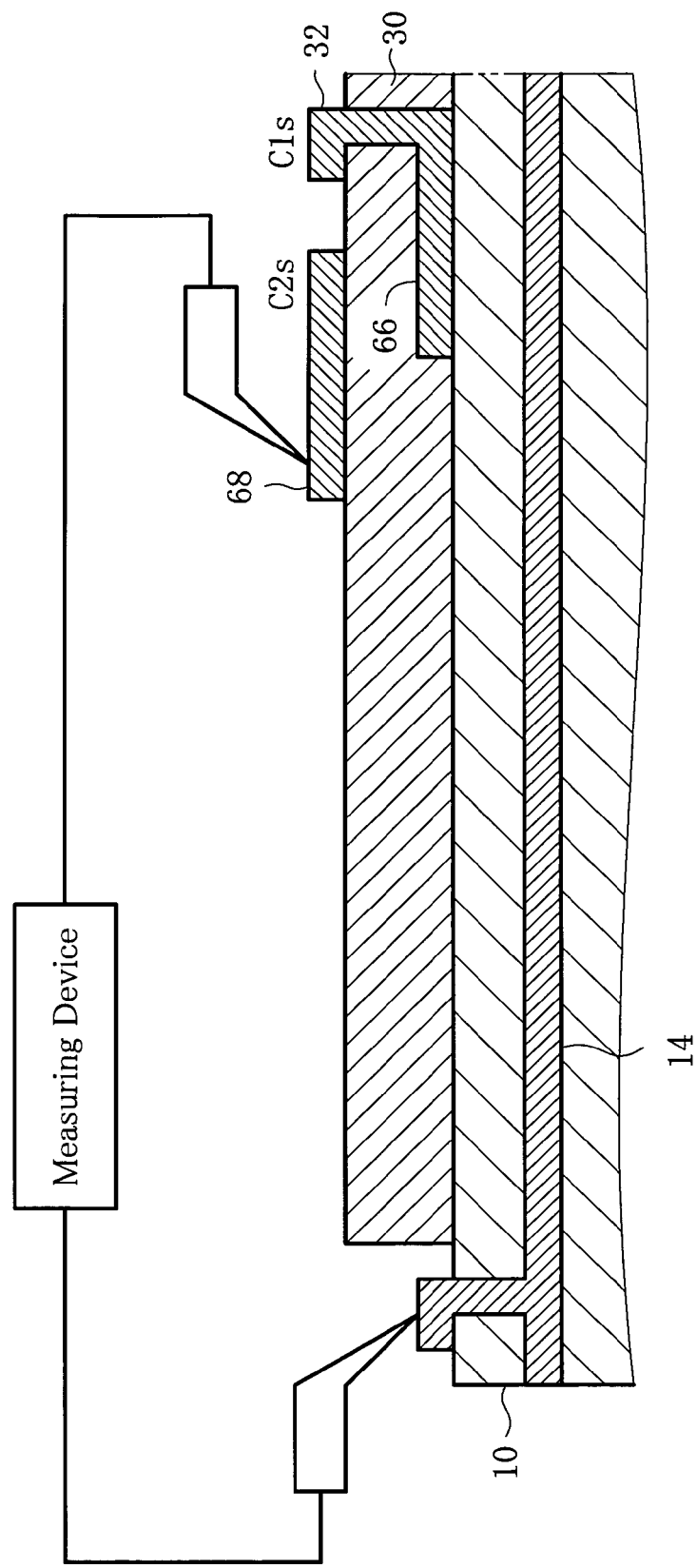
FIG. 7 is a sectional view showing the first embodiment after further formation of the first insulating layer and the second conductor layer on the state shown in FIG. 6.

Referring now to FIG. 7, there is shown a sectional view showing the first embodiment after further formation of the first insulating layer 30 and the second conductor layer 32 on the state shown in FIG. 6. The second conductor layer 32 has the second reference pattern 68 in addition to the predetermined wiring pattern. Also for the second reference pattern 68, an electric capacitance C2s is measured between it and the internal conductor pattern 14 of the ceramic substrate 10. A theoretical electric capacitance for the wiring path consisting of the wiring pattern made of the second conductor layer and the wiring pattern made of the first conductor layer connected thereto (i.e., C1a+C2a in FIG. 2) is calculated with the use of the electric capacitance C1s of the first reference pattern 66 and the electric capacitance C2s of the second reference pattern 68. Namely, the calculated value Ct of electric capacitance for the wiring path is as follows:

$$Ct = k1 \times C1s + k2 \times C2s.$$

The symbol k1 denotes an area ratio of the wiring pattern, which is contained in the wiring path, made of the first conductor layer to the first reference pattern 66, whereas k2 denotes an area ratio of the wiring pattern, which is contained in the wiring path, made of the second conductor layer to the second reference pattern 68. The calculated value Ct is then compared to the measured value Cm of electric capacitance for the wiring path in question to determine whether the wiring path extending to the second conductor layer is good or bad.

In this case, since the electric capacitance C1s for the first reference pattern 66 has been measured in the state shown in FIG. 6, this value is usable as it is. It is preferable, however, that the electric capacitance C1s for the first reference pattern 66 is re-measured in the state shown in FIG. 7, because the electric capacitance C1s may slightly vary under the influence of formation of the first insulating layer 30 and the second conductor layer 32.

Figure 8:
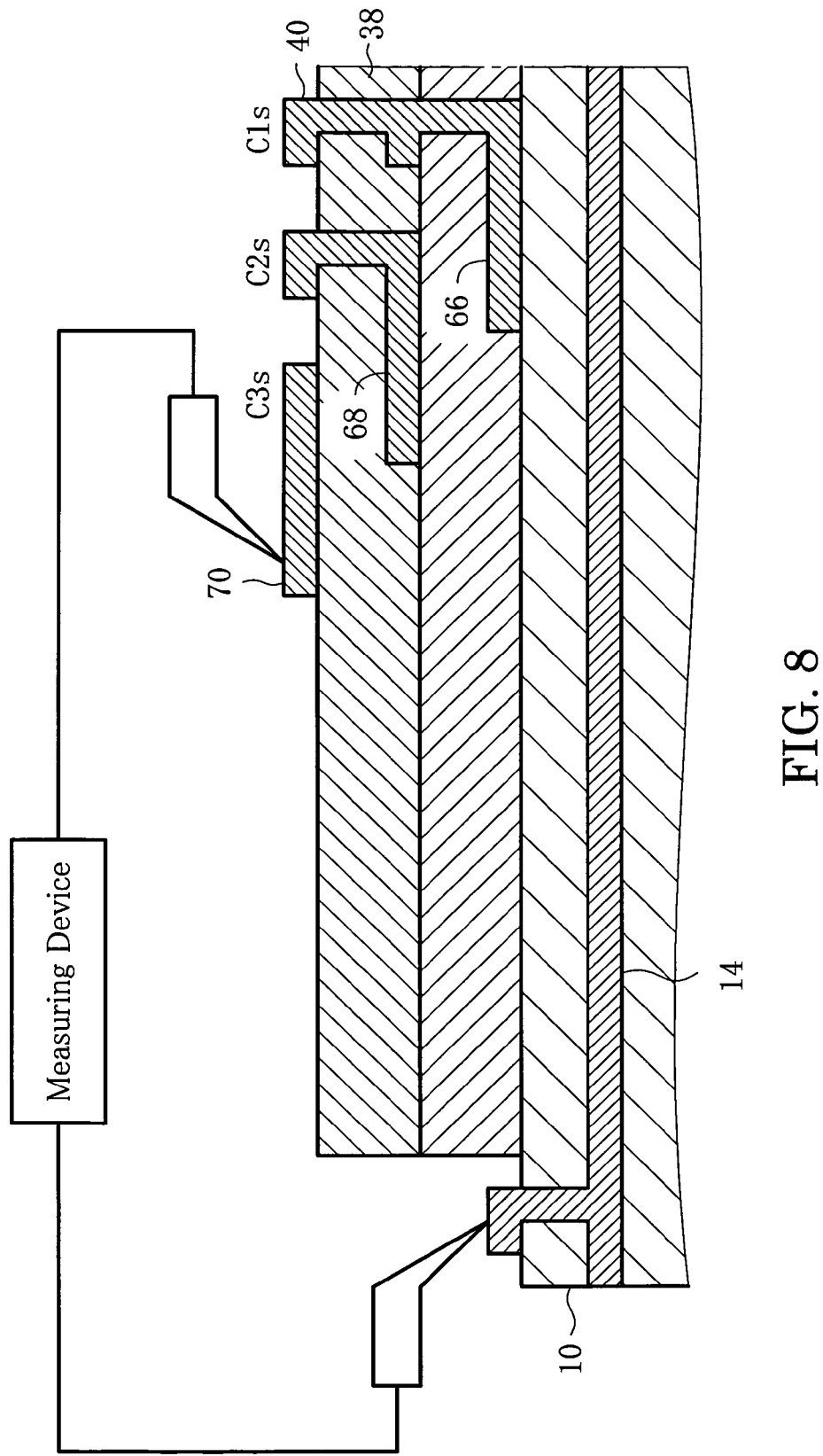
FIG. 8 is a sectional view showing the first embodiment after further formation of the second insulating layer and the third conductor layer on the state shown in FIG. 7.

Referring now to FIG. 8, there is shown a sectional view showing the first embodiment after further formation of the second insulating layer 38 and the third conductor layer 40 on the state shown in FIG. 7. The third conductor layer 40 has the third reference pattern 70 in addition to the predetermined wiring pattern. Also for the third reference pattern 70, an electric capacitance C3s is measured between it and the internal conductor pattern 14 of the ceramic substrate 10. A theoretical electric capacitance for the three-dimensional wiring path extending from the wiring pattern made of the first conductor layer to the wiring pattern made of the third conductor layer (i.e., C1a+C2a+C3a in FIG. 3) is calculated with the use of the electric capacitance C1s of the first reference pattern 66, the electric capacitance C2s of the second reference pattern 68, and the electric capacitance C3s of the third reference pattern 70. Namely, the calculated value Ct of electric capacitance for the wiring path is as follows:

$$Ct = k1 \times C1s + k2 \times C2s + k3 \times C3s.$$

The calculated value Ct is then compared to the measured value Cm of electric capacitance for the wiring path in question to determine whether the wiring path extending to the third conductor layer is good or bad.

Also in this case, it is preferable that the electric capacitance C1s for the first reference pattern 66 and the electric capacitance C2s for the second reference pattern 68 are re-measured to be used in the calculation. Similarly, it is preferable that the electric capacitances for the reference patterns that should be used for the defect judgment are re-measured on each occasion in calculation for the third and subsequent conductor layers.

Figure 9:
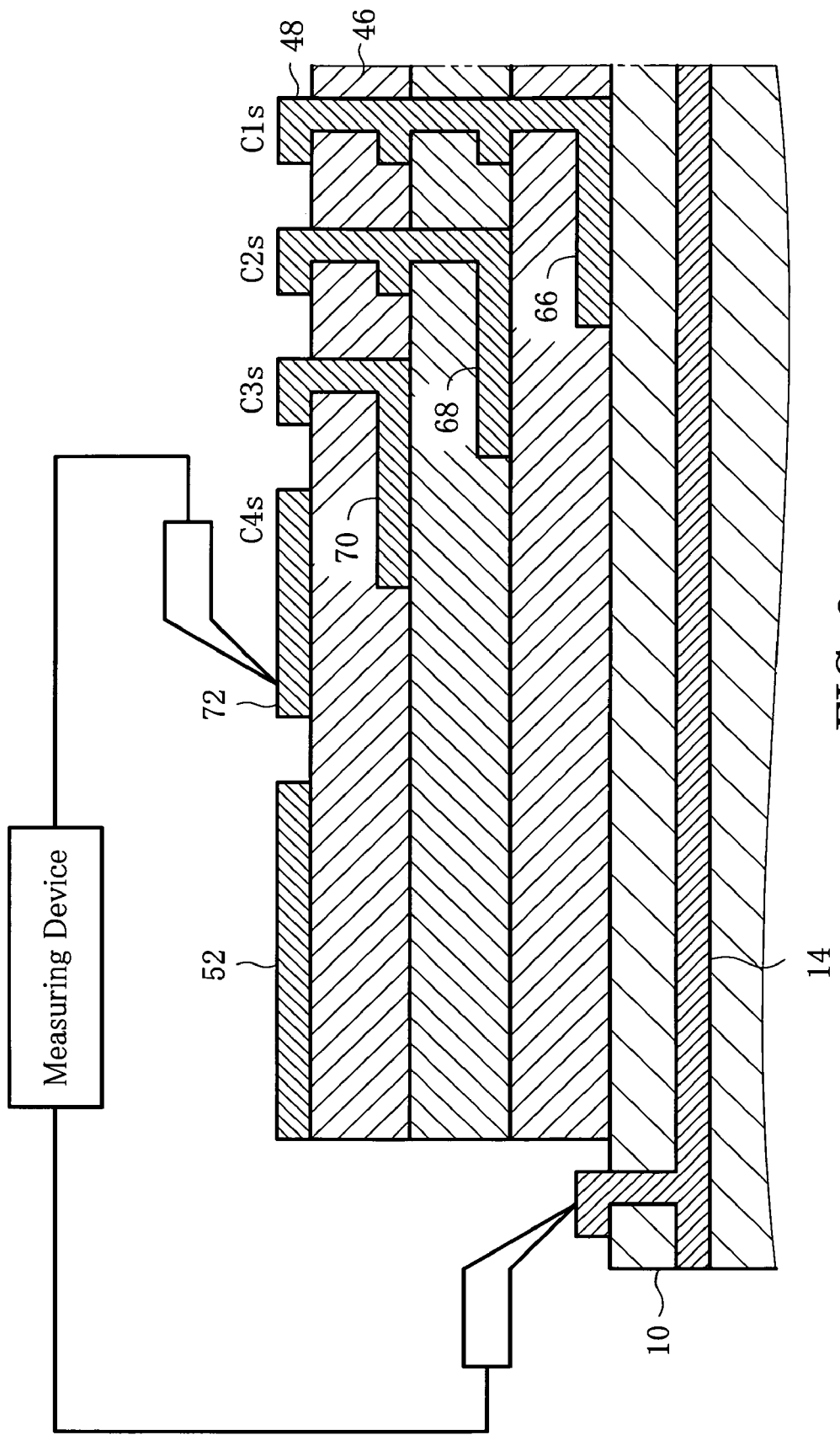
FIG. 9 is a sectional view showing the first embodiment after further formation of the third insulating layer and the fourth conductor layer on the state shown in FIG. 8.

Referring now to FIG. 9, there is shown a sectional view showing the first embodiment after further formation of the third insulating layer 46 and the fourth conductor layer 48 on the state shown in FIG. 8. The fourth conductor layer 48 has the fourth reference pattern 72 in addition to the predetermined wiring pattern. Also for the fourth reference pattern 72, an electric capacitance C4s is measured between it and the internal conductor pattern 14 of the ceramic substrate 10. A theoretical electric capacitance for the three-dimensional wiring path extending from the wiring pattern made of the first conductor layer to the wiring pattern made of the fourth conductor layer, i.e., (C1a+C1b)+(C2a+C2b)+(C3a+C3b)+(C4a+C4b) in FIG. 4, is calculated with the use of the electric capacitance C1s of the first reference pattern 66, the electric capacitance C2s of the second reference pattern 68, the electric capacitance C3s of the third reference pattern 70, and the electric capacitance C4s of the fourth reference pattern 72. Namely, the calculated value Ct of electric capacitance for the wiring path is as follows:

$$Ct = k1 \times C1s + k2 \times C2s + k3 \times C3s + k4 \times C4s.$$

The calculated value Ct is then compared to the measured value Cm of electric capacitance for the wiring path in question to determine whether the wiring path extending to the fourth conductor layer is good or bad.

Incidentally, if the fourth conductor layer 48 has, as in the case shown in FIG. 4, the grounded pattern 52 and therefore the ground potential exists at both the grounded pattern 52 and the internal conductor layer 14 of the ceramic substrate 10, it is a must rather than preferable, for the fourth and subsequent conductor patterns, that the electric capacitances for all reference patterns that have been formed should be re-measured for each occasion after formation of each conductor layer. It is definite that the existence of the grounded pattern 52 widely shifts the measured electric capacitances C1$s$, C2$s$ and C3$s$ for the first, second and third reference patterns 66, 68 and 70, and thus these electric capacitances must be re-measured because of the reason described below. It is noted that the measured values C1$s$, C2$s$ and C3$s$ that were measured before formation of the grounded pattern 52 are the electric capacitances between the reference patterns and the internal conductor layer 14. In contrast, the electric capacitances for the respective reference patterns after formation of the grounded pattern 52 are those between them and the whole grounded region consisting of the grounded pattern 52 and the internal conductor layer 14. Therefore, it is no wonder to measure C4$s$ after formation of the fourth conductor layer 48 having the grounded pattern, and further it is necessary to definitely re-measure C1$s$, C2$s$ and C3$s$ too. For enabling such re-measurement, the respective reference patterns 66, 68 and 70 should extend to the fourth conductor layer 48 via connecting conductors passing through the respective insulating layers. With the use of the thus measured C1$s$, C2$s$ and C3$s$, the calculated value Ct of electric capacitance for the wiring path is as follows:

$$Ct=k1\times C1s+k2\times C2s+k3\times C3s+k4\times C4s.$$

Figure 10:
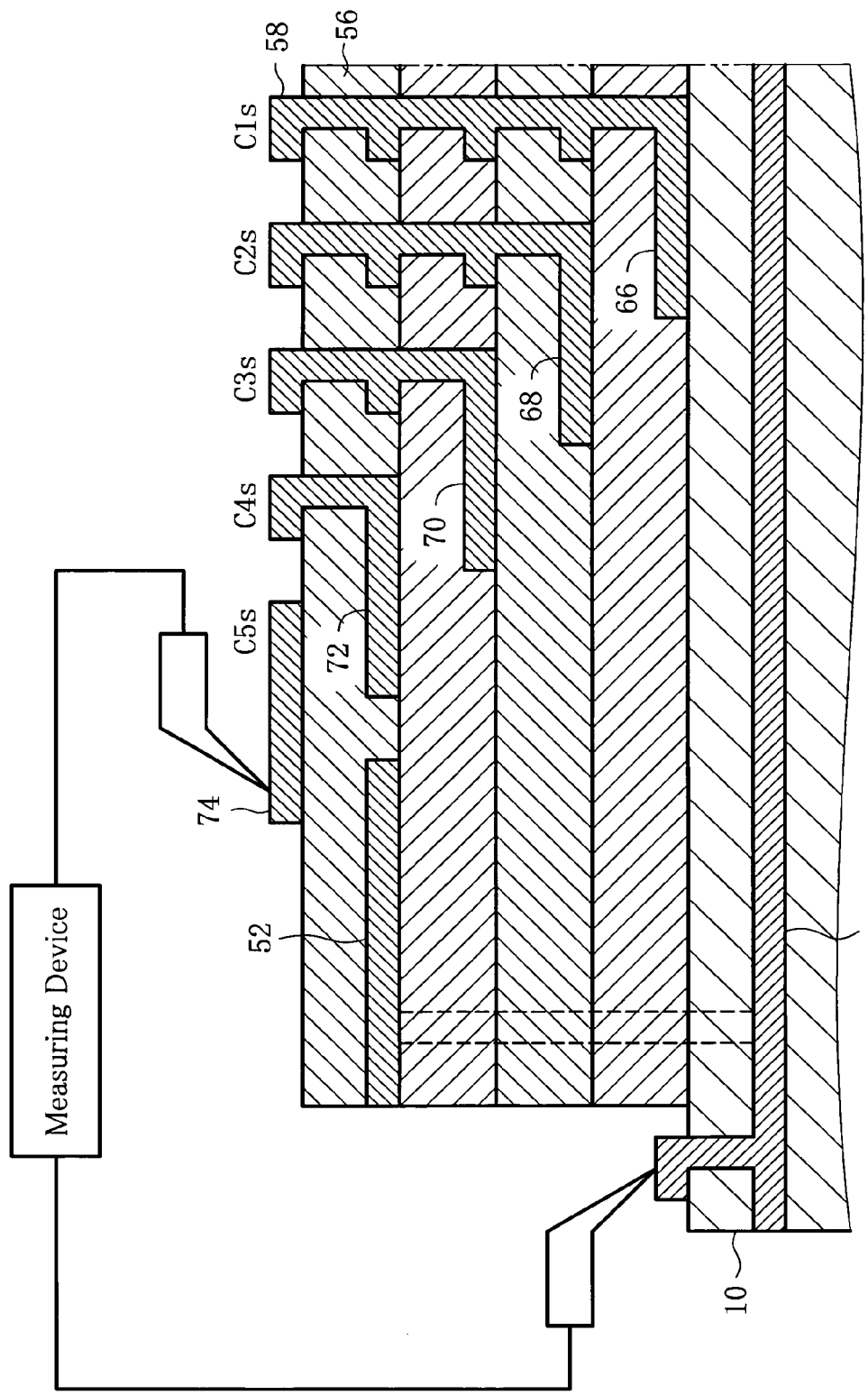
FIG. 10 is a sectional view showing the first embodiment after further formation of the fourth insulating layer and the fifth conductor layer on the state shown in FIG. 9.

Referring now to FIG. 10, there is shown a sectional view showing the first embodiment after further formation of the fourth insulating layer 56 and the fifth conductor layer 58 on the state shown in FIG. 9. The fifth conductor layer 58 has the fifth reference pattern 74 in addition to the predetermined wiring pattern that is usable as element mounting pads. Also for the fifth reference pattern 74, an electric capacitance C5$s$ is measured between it and the ground potential, which exists at both the grounded pattern 52 and the internal conductor pattern 14. If the multilayer wiring section includes therein the grounded pattern 52, the measured electric capacitance C5$s$ corresponds to that between the reference pattern 74 and the whole grounded region consisting of the grounded pattern 52 and the internal conductor layer 14. A theoretical electric capacitance for the three-dimensional wiring path extending from the wiring pattern made of the first conductor layer to the wiring pattern made of the fifth conductor layer, i.e., (C1$a$+C1$b$)+(C2$a$+C2$b$)+(C3$a$+C3$b$)+(C4$a$+C4$b$)+(C5$a$+C5$b$) in FIG. 5, is calculated with the use of the electric capacitance C1$s$ of the first reference pattern 66, the electric capacitance C2$s$ of the second reference pattern 68, the electric capacitance C3$s$ of the third reference pattern 70, the electric capacitance C4$s$ of the fourth reference pattern 72, and the electric capacitance C5$s$ of the fifth reference pattern 74. Namely, the calculated value Ct of electric capacitance for the wiring path is as follows:

$$Ct=k1\times C1s+k2\times C2s+k3\times C3s+k4\times C4s+k5\times C5s.$$

The calculated value Ct is then compared to the measured value Cm of electric capacitance for the wiring path in question to determine whether the wiring path extending to the fifth conductor layer is good or bad.

Continuing to refer to FIG. 10, each of the reference patterns 66, 68, 70, 72 and 74 has a line width, which is preferably the same as the line width of the wiring pattern formed in each conductor layer. The line width may be 25 micrometers for example. An electric capacitance between the reference pattern having such a width and the internal conductor layer 14 would be about one through two picofarads per one centimeter. Assuming that the length L of the reference pattern is 10 mm, the electric capacitance between the reference pattern and the internal conductor layer 14 would be about one though two picofarads.

Figure 13:
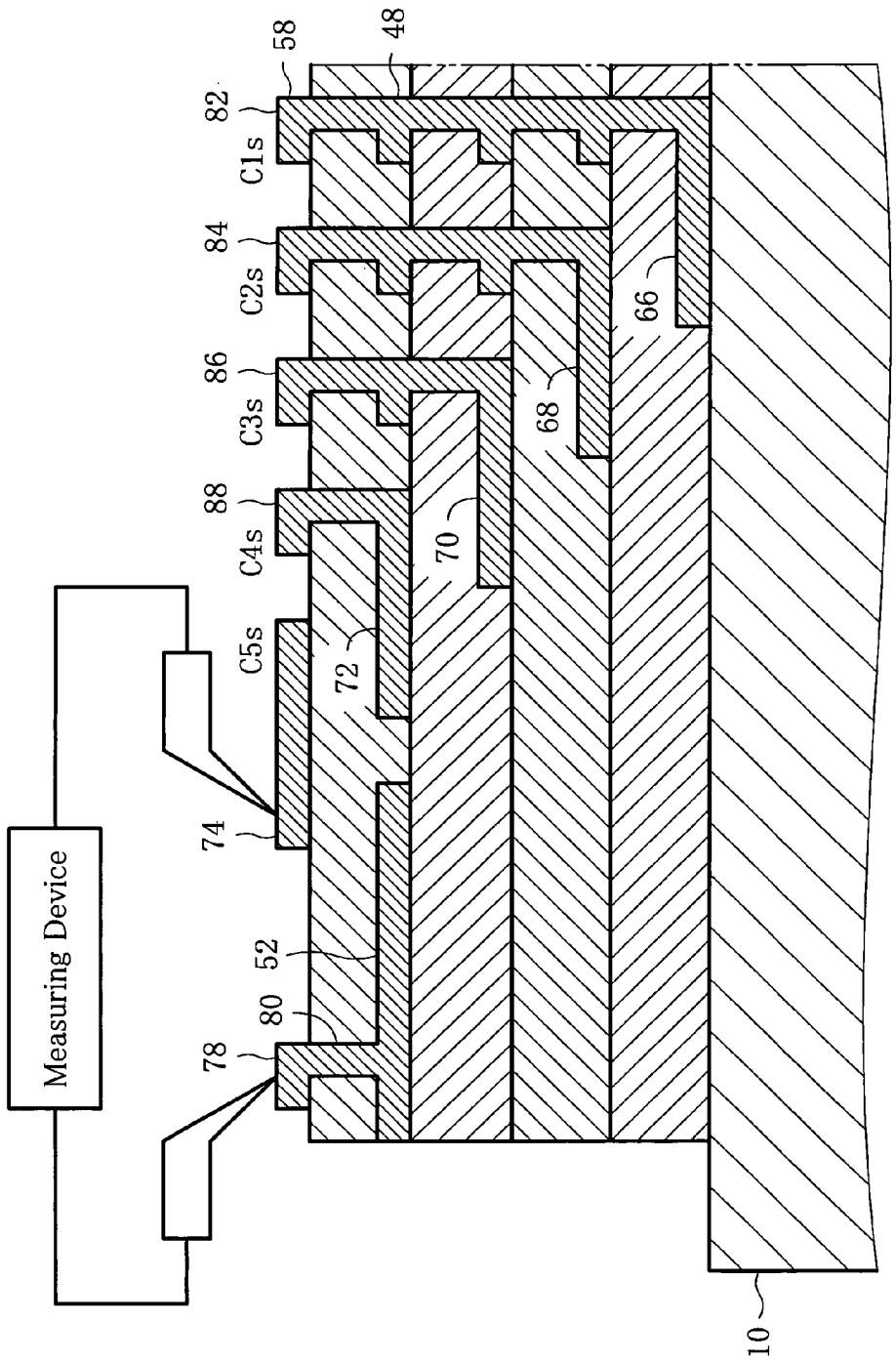
FIG. 13 is a sectional view of the second embodiment of the multilayer wiring board according to the present invention.

Next, the second embodiment of the present invention will now be described. In this embodiment, the ceramic substrate has no internal conductor layer. Referring now to FIG. 13, there is shown a sectional view showing the second embodiment of the multilayer wiring board. FIG. 13 shows only the reference patterns 66, 68, 70, 72 and 74 of the respective conductor layers, other wiring patterns of the respective conductor layers being omitted. FIG. 13 is similar to FIG. 10 in the first embodiment except for the ceramic substrate 10 having no internal conductor layer 14. Furthermore, a test pad 78 appears on the surface of the multilayer wiring section, the test pad 78 being formed in the fifth conductor layer 58. The test pad 78 is connected via a connecting conductor 80 to the grounded pattern 52 of the fourth conductor layer 48. The fifth conductor layer 58 further includes the reference pads 82, 84, 86 and 88, each of which is connected to each of the reference patterns 66, 68, 70 and 72 via a connecting conductor passing through one or more insulating layers. It is noted that the fifth reference pattern 74 serves also as the reference pad for the fifth conductor layer 58.

Since the conductive layers have the respective reference patterns 66, 68, 70, 72 and 74, the electric capacitances C1$s$, C2$s$, C3$s$, C4$s$ and C5$s$ for the reference patterns can be measured between the test pad 78 and the reference pads 82, 84, 86, 88 and 74. Then, the electric capacitance for the three-dimensional wiring path can be accurately calculated with the use of the capacitances C1$s$, C2$s$, C3$s$, C4$s$ and C5$s$. The calculated value is compared to the measured value of electric capacitance for the wiring path to determine whether the wiring path is good or bad. It should be noted, however, that the electric capacitances C1$s$, C2$s$, C3$s$, C4$s$ and C5$s$ for the reference patterns are measured after completion of the multilayer wiring section, because the grounded pattern 52 exists only inside the multilayer wiring section (i.e., in the fourth conductor 48 in this embodiment). Accordingly, in the second embodiment, it is impossible to inspect the defect of the wiring path on each occasion after forming each conductor layer, that is to say, it is impossible to inspect the defect halfway through a production process of the multilayer wiring board.

The present invention is not limited to the embodiments mentioned above. The number of the conductor layers contained in the multilayer wiring section may be any number not smaller than two.

What is claimed is:

1. A multilayer wiring board comprising:
   (a) an electrical insulating base substrate, which is a common part among a variety of the multilayer wiring boards; and
   (b) a multilayer wiring section formed on the base substrate, the multilayer wiring section being a characteristic part different from others among a variety of the multilayer wiring boards and having a laminated structure consisting of alternating layers of plural conductor layers and plural insulating layers, and the multilayer wiring section further having at least one three-dimensional wiring path, which consists of an interconnection of wiring patterns belonging to the respective conductor layers via connecting conductors passing through the respective insulating layers, wherein at least one of the conductor layers includes a grounded pattern;

the multilayer wiring section has a test pad, which appears on a surface of the multilayer wiring section and is connected to the grounded pattern; and each of the conductor layers in the multilayer wiring section includes a reference pattern having a predetermined length, the reference pattern being usable as a standard for an electric capacitance.

2. The multilayer wiring board according to claim 1, wherein the reference pattern has a line width, which is equal to a line width of the wiring pattern formed in each of the conductor layers in the multilayer wiring section.

3. The multilayer wiring board according to claim 1, wherein the multilayer wiring section has plural reference pads appearing on a surface of the multilayer wiring section, and the reference pattern included in each of the conductor layers is connected to each of the reference pads via connecting conductors passing through at least one of the insulating layers.

4. A method of testing a multilayer wiring board, the method comprising the steps of:

providing the multilayer wiring board, which includes:

(a) an electrical insulating base substrate, which is a common part among a variety of the multilayer wiring boards; and (b) a multilayer wiring section formed on the base substrate, the multilayer wiring section being a characteristic part different from others among a variety of the multilayer wiring boards and having a laminated structure consisting of alternating layers of plural conductor layers and plural insulating layers, and the multilayer wiring section further having at least one three-dimensional wiring path, which consists of an interconnection of wiring patterns belonging to the respective conductor layers via connecting conductors passing through the respective insulating layers, wherein at least one of the conductor layers includes a grounded pattern;

the multilayer wiring section has a test pad, which appears on a surface of the multilayer wiring section and is connected to the grounded pattern; and each of the conductor layers in the multilayer wiring section includes a reference pattern having a predetermined length, the reference pattern being usable as a standard for an electric capacitance, and further the reference pattern being connected to a reference pad appearing on a surface of the multilayer wiring section via a connecting conductor passing through at least one of the insulating layers, obtaining a reference value of electric capacitance by measuring an electric capacitance between the reference pad and the test pad for each of the conductor layers;

obtaining a calculated value of electric capacitance by calculating an electric capacitance between the wiring path and the grounded pattern with the use of an area ratio of the wiring pattern included in each of the conductor layers to each of the reference patterns and the reference value of electric capacitance for each of the conductor layers;

obtaining a measured value of electric capacitance by measuring an electric capacitance between the test pad and an exposed end of the wiring path, the exposed end appearing on the surface of the multilayer wiring section; and determining whether the wiring path is good or bad by comparing the calculated value with the measured value.

5. The testing method according to claim 4, wherein the reference pattern has a line width, which is equal to a line width of the wiring pattern formed in each of the conductor layers.

* * * * *